United States Patent [19]

Moser et al.

[11] 4,441,138

[45] Apr. 3, 1984

[54] CHARGE CELL

[75] Inventors: Jean-Frédéric Moser, Oberwil; Heinrich P. Baltes, Zug, both of Switzerland

[73] Assignee: LGZ Landis & Gyr Zug A.G., Zug, Switzerland

[21] Appl. No.: 340,841

[22] Filed: Jan. 20, 1982

[30] Foreign Application Priority Data

Jan. 26, 1981 [CH] Switzerland ........................... 468/81

[51] Int. Cl.$^3$ ...................... H01G 1/08; H01G 4/06
[52] U.S. Cl. .................................... 361/274; 361/311
[58] Field of Search ................ 361/311, 274; 307/305, 307/320

[56] References Cited

U.S. PATENT DOCUMENTS

| 3,274,025 | 9/1966 | Ostis ................................ 361/311 X |
| 3,543,105 | 11/1970 | Svedberg et al. ............... 307/305 X |
| 3,704,174 | 11/1972 | Berger ................................. 136/153 |
| 3,708,729 | 1/1973 | Berger ................................. 317/230 |
| 3,710,201 | 1/1973 | Ikeda et al. ........................ 317/230 |
| 3,911,297 | 10/1975 | Merrin et al. ................... 307/320 X |
| 4,205,364 | 5/1980 | Pereira ............................. 361/311 X |

FOREIGN PATENT DOCUMENTS

| 785 | 2/1979 | European Pat. Off. . |
| 2806464 | 8/1979 | Fed. Rep. of Germany . |

Primary Examiner—Donald A. Griffin
Attorney, Agent, or Firm—Ernest F. Marmorek

[57] ABSTRACT

A cell which is arranged to allow the transfer of charges between two electrodes, includes two electrically conducting electrodes spaced apart from one another, and a solid dielectric material disposed between the electrodes, and including a certain quantity of carriers of a positive charge trapped therein.

12 Claims, 6 Drawing Figures

Fig. 1
Fig. 1A
Fig. 1B
Fig. 1C
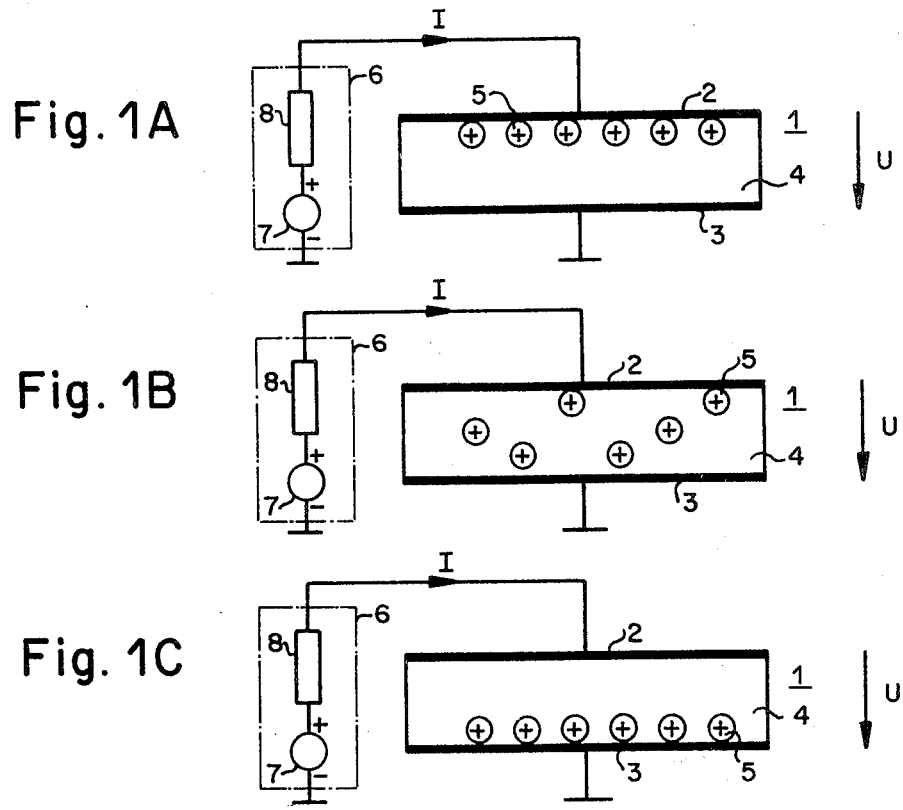
Fig. 2
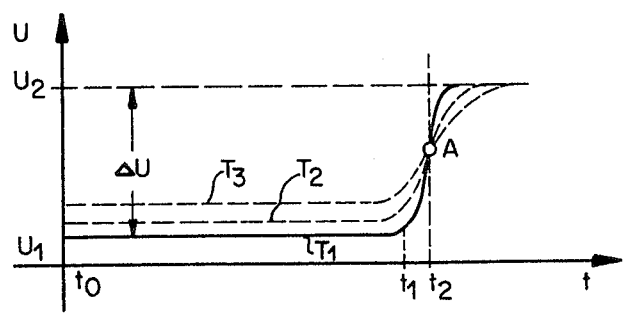

CHARGE CELL

BACKGROUND OF THE INVENTION

Charge cells are used inter alia as electrical charge integrators or electrical reference units, for example when measuring time or electrical charges. Electrical charge units, can, for example, be used in electricity meters for determining the value $$\int_0^t I\,dt,$$

where I represents the transfer current of a charge cell.

Electric charge cells, which operate according to the Faraday principle, and serve to measure electrical charge quantities (Coulomb) are known. Charge cells of this type consist as a rule of two metallic electrodes, for example of silver or mercury, which are separated from one another by an electrolytic solution. An electrical current passing through the cell transfers metal ions from one electrode to the other, and deposits them there. This process is reversable, so that a reversal of the direction of the current permits resetting of the cell to the initial state.

Electrolytic charge cells of this type have various disadvantages, such as inability to be integrated in socalled integrated semiconductor circuits, sensitivity with respect to mechanical impacts and/or vibration, limited life, temperature dependency of the ion concentration and, when used over a long time, for example, over a period of 10 years, unpredictable changes in the ion concentration and/or chemical reaction of the electrolytic solution with the housing.

SUMMARY OF THE INVENTION

It is therefore a principal object of the present invention to device a charge cell obviating the aforesaid disadvantages.

This object is attained in a cell arranged to shift charges between two electrically conducting electrodes spaced apart from one another. It includes a solid dielectric material disposed between the electrodes, and a certain quantity of carriers of a positive charge trapped therein.

Further objects and advantages of the invention will be set forth in part in the following specification, and in part will be obvious therefrom, without being specifically referred to, the same being realized and attained as pointed out in the claims hereof.

BRIEF DESCRIPTION OF THE DRAWINGS

For a fuller understanding of the nature and objects of the invention, reference should be had to the following detailed description, taken in connection with the accompanying drawings in which:

FIG. 1A is a solid-state cell in a first state;

FIG. 1B is a solid-state cell in a second state;

FIG. 1C is a solid state cell in a third state;

FIG. 2 is a graph showing operating curves of a charge cell,

The same reference numerals have been used for identical parts in different figures of the drawing.

DESCRIPTION OF THE PREFERRED EMBODIMENTS

Figure 3:
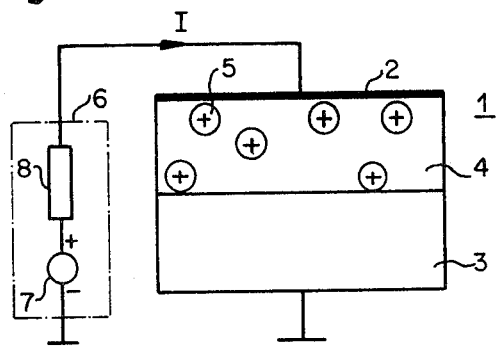
FIG. 3 is a block schematic diagram of a solid-state cell capable of being incorporated into an integrated circuit.

In carrying the invention into effect, and referring now particularly to FIG. 1, a solid-state charge cell 1 consists substantially of a first electrode 2, a second electrode 3, and a dielectric material disposed between the two electrodes 2 and 3, in which a predetermined quantity $Q_{ref}$ of positive charge carriers 5 is trapped. The second electrode 3 is connected to ground, and the first electrode 2 is fed by the positive pole of a direct currrent source 6, represented by a voltage source 7, and internal resistance 8 connected therewith in series. Both electrodes 2 and 3 are made of electrically well conducting metal, for example, of gold or aluminum.

The basic invention deals with the exploitation of an otherwise highly undesired effect in the silicon-planar technology, namely the use of trapped positive charge carriers, for example of $N_a{}^+$-ions, in, for example a silicone oxide layer, which, as "trapped ions", cannot be displaced either by thermal diffusion, or by the application of an electric field. In the classic silicon-planar technology, extremely clean and careful workmanship must prevent the existence of otherwise all-present $N_a{}^+$-ions, as otherwise undesired leakage currents and stray capacities would arise.

This effect has been made use of for the charge cell 1, according to the present invention, in which a certain quantity $Q_{ref}$ of such persistent positive charge carriers 5 have been purposely baked into a solid-state dielectric material 4 by means of ion implantation. Alkali ions are particularly suitable as positive charge carriers. In FIG. 2 the change in the charge condition of the charge cell 1 is illustrated showing the potential difference U across the cell 1 as a function of time.

It is assumed that at the start, namely during the time when t is smaller than $t_0$, that for example, all positive charge carriers of the dielectric material 4 are localized at the border of the layer (FIG. 1A).

At the time $t=t_0$, the positive voltage of the direct current source 6 is connected with the aid of a (non-illustrated) switch to the first electrode 2.

The electric field generated by this positive voltage across the dielectric material 4 causes the positive charge carriers 5 to migrate in the dielectric material 4 in a direction to the border of the layer 4-3 (FIG. 1B). Thus during the time period $t=t_0$ to $t=t_1$, a current of positive charge carriers 5 is flowing, and the electrical internal resistance $R_Q$ of the charge cell 1 is very small in relation to the internal resistance 8 of the voltage or current source. The potential difference U across the cell 1 remains constant during this time, is very small, and has a value $U_1$, (FIG. 2) as long as all ions participate during the migration. As soon as all positive charge carriers 5 have reached the border layer 4-3 at the time $t=t_1$, (FIG. 1C) the current of positive charge carriers 5 ceases, so that the potential difference U across the cell 1 suddenly increases to the high potential difference $U_2$ of the voltage source 7, as the charge cell 1 now acts as a pure capacitor, and is quickly charged by the high-ohmic current source 6 to the value $U_2$.

This process is reversible, because as a result of switching over of the direct current source 6 the migration of the positive charge carriers may again be reversed, and these positive charge carriers 5 then flow back from the border layer 4-3 to the border layer 2-4. Because these positive charge carriers 5 are "trapped" within the solid dielectric material 4, this reversible migration of the electric charges is accomplished without any charge being lost.

As is true of most semiconductor effects, a very strong temperature dependence is, however, present. For the charge current I, for example, the equation $I \simeq (E/T) \cdot e^{-(E_{Ai}/kT)}$, where $E_{Ai}$ represents the activation energy of the dielectric material 4, E the applied electric field, k the Boltzmann constant, and T the absolute temperature. Thus the transfer current I and also the electrical internal resistance $R_Q$ of the cell 1 is a function of temperature. This means that the value $U_1$ of the potential drop U across the cell 1 is also dependent on temperature. This temperature dependence of $U_1$ can be exploited, for example, if the cell 1 is used as a temperature sensor. The full line of FIG. 2 applies to the temperature $T=T_1$. Another dotted line represents the temperature $T=T_2$, and still another line represents the temperature $T=T_3$. The end value $U_2$ is equal for all three characteristic lines, and is only determined by the voltage source 7. The initial value $U_1$, and therefore also $\Delta U = U_2 - U_1$ is, however, different for all three characteristic lines. In order to keep the influence of temperature on the transfer current I as small as possible, the value $R_i$ of the internal resistance 8 of the direct current source 6 must be chosen very much larger than the value of the internal resistance $R_Q$ of the charge cell 1. The value of the transfer current $I = U_2/(R_i + R_Q) \simeq U_2/R_i$ is therefore, to all intents and purposes, no longer determined by $R_Q$ and is thus in practice independent of temperature.

The three characteristic lines of FIG. 2 have approximately the same value at the time $t=t_2$ (Point A). In view of the steepness of the characteristic lines at the point A, $t_2$ is approximately equal to $t_1$, and therefore also the transfer time $t_2-t_0$ of the charge cell 1 becomes temperature independent. This transfer time may be chosen within a wide range, namely from about 1/10 of a second, to 100 hours. The temperature independence of the transfer time $t_2-t_0$, or of its inverted value, namely the transfer frequency $f=1/(t_2-t_0)$, permits an accurate and temperature-independent measurement of the value of $$\int_{t_0}^{t_2} I \cdot dt = I(t_2 - t_0) = I/f = Q_{ref}.$$

In the embodiment shown in FIG. 3, the entire second metallic electrode 3 is replaced by a semiconductor substrate provided with a lead composed of n-, n+-, p-, or p+-silicon. As a dielectric 4 there is preferably used here a thin layer of silicon oxide, according to known method of the silicon-planar technology, so that the charge cell 1 may be integrated within a so-called integrated circuit. This in turn has the advantage, that any possibly remaining small temperatures dependencies may be compensated, by placing within the semiconductor substrate of the integrated circuit a second charge cell, traversed by a known current, in the vicinity of the charge cell 1, whose reference transfer frequency then may be used to correct any temperature dependence of the measured transfer frequency f of the first charge cell 1. Stating it in other words, the first cell has a predetermined temperature dependence, and the other cell, which is similar to the first cell, has a prearranged temperature dependence which is at least partly opposite to the predetermined temperature dependence of the first cell, so that the cells may be connected to one another, so as to reduce the predetermined temperature dependence. Both cells will be exposed to the same temperature due to their proximity within the semiconductor substrate.

Thin layers of silicon oxide may be, for example manufactured by thermal oxidation of the silicon semiconductor substrate; during the oxidation process or even thereafter $Na^+$- or $Li^+$-ions may be implanted therein.

Figure 4:
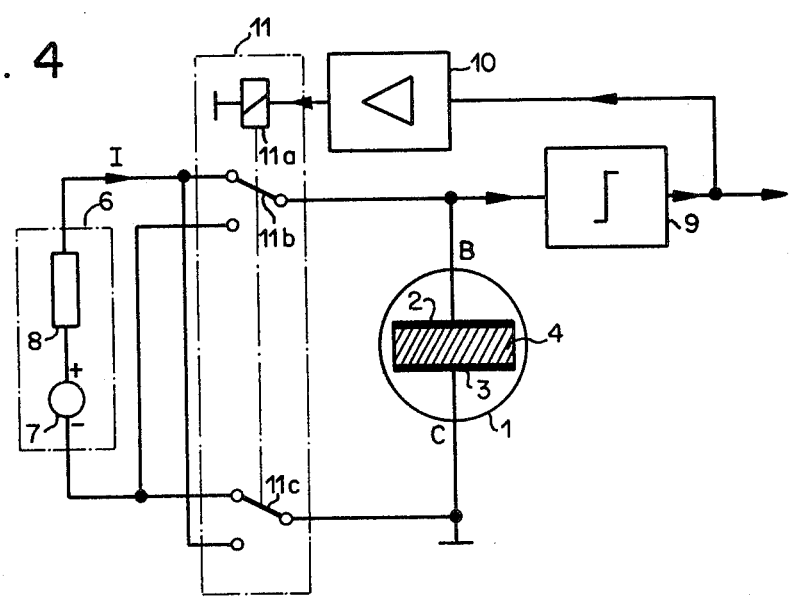
FIG. 4 is a schematic diagram of a circuit including a charge cell incorporating a switch to reverse the transfer direction.

In FIG. 4 there is shown an example of a switching circuit for a charge cell 1. In addition to the elements originally discussed, there is provided a voltage detector 9, an amplifier 10, and an electromagnetic relay 11, inclusive of a coil 11a, a first switch-over contact 11b, and a second switch-over contact 11c. The first pole B of the cell 1 is connected to the input of the voltage detector 9, and is connected through the operating contact of the first switch-over contact 11b to the negative pole of the direct current source 6, and is connected through the stationary contact of the same switch-over contact 11b with its positive pole. The second pole C of the cell 1 is connected to ground, and connected through the operating contact of the second switch-over contact 11c to the positive pole of the direct current source 6, and through the stationary contact of the same switch-over contact 11c to its negative pole. The output of the voltage detector 9 controls the input of the amplifier 10, and simultaneously forms the output of the entire circuit. A first pole of the coil 11a of the electromagnetic relay 11 is connected to ground, while the second pole thereof is fed by the output of the amplifier 10. The switch contacts 11b and 11c of the electromagnetic relay 11 permit switching of the current source 6 at respective opposite polarities, so that the transfer current I passes through the cell in one position of the switch from B to C, and in another position of the switch from C to B. The input of the voltage detector 9 has a high ohmic resistance, and hardly loads the circuit of the cell 1. As soon as the absolute value of the voltage at the pole B of the cell 1 exceeds a certain value represented in FIG. 1 by the point A, the output of the voltage detector 9 switches the electromagnetic relay 11 over with the aid of the amplifier 10, and consequently also changes the polarity of the direct current source 6. Each switch-over trail at the output of the voltage detector 9 is therefore a signal that the direct current source has supplied with the aid of the transfer current a certain predetermined quantity $Q_{ref}$ of electrical charges to the charge cell 1. In other words, the number of switching impulses at the output of the voltage detector 9 is a measure of the total quantity Q of electric charges, which have been supplied by the direct current source 6 to one of the electrodes of the cell 1.

If the transfer current I is proportional to any measurement value, for example to the instantaneous apparent output $P = u \cdot i$ of an electric consumer, and if a current transducer for the required measurement value has a high ohmic resistance, that is, it represents a current source, then the circuit shown in FIG. 4 can be used to measure the time integral of this measurement value, in the present case, of the consumed energy.

In the instant example the consumed energy is therefore $$\int_0^t P.dt = \int_0^t u.i.dt = K \int_0^t I dt = K.Q = K.Q_{ref}.N,$$

where K is a proportional constant, and N is the number of switch-over impulses appearing during the time t at the output of the voltage detector 9.

We wish it to be understood that we do not desire to be limited to the exact details of construction shown and described, for obvious modifications will occur to a person skilled in the art.

Having thus described the invention, what we claim as new and desire to be secured by Letters Patent is as follows:

1. A charge cell, for use in measuring charge values, free of any electrolyte and free of any glassy or amorphous composition, and arranged to transfer charges between two electrodes, so that at the end of said transfer the potential difference across sais charge cell will suddenly increase,
   comprising in combination,
   two electrically conducting electrodes spaced apart from one another, and
   a single layer of one single solid dielectric material disposed between said electrodes, and including a predetermined quantity of carriers of a positive charge trapped and remaining trapped therein.

2. A cell as claimed in claim 1, wherein said carriers of a positive charge include positive ions.

3. A cell as claimed in claim 2, wherein said positive ions include alkali ions.

4. A cell as claimed in claim 1, wherein said solid dielectric material is in the form of a relatively thin layer.

5. A cell as claimed in claim 1, wherein said solid dielectric material includes silicon dioxide.

6. A cell as claimed in claim 1, wherein said electrically conducting electrodes include metallic electrodes.

7. A cell as claimed in claim 1, wherein at least one of said electrodes includes a semiconductor substrate.

8. A cell as claimed in claim 7, wherein said semiconductor substrate is taken from the group consisting of n-silicon, n± silicon, p-silicon, and p± silicon.

9. A cell as claimed in claim 7, wherein said cell is adapted to form part of an integrated circuit.

10. An integrated circuit free of any electrolyte comprising in combination
    two electrically conducting electrodes spaced apart from one another, and
    a single solid dielectric material disposed between said electrodes and including a certain quantity of carriers of a positive charge therein,
    said two electrodes and said dielectric material forming a cell arranged to transfer charges between two electrodes.

11. An integrated circuit as claimed in claim 10, wherein said cell is a first cell having a predetermined temperature-dependence, and further comprising another cell similar to said first cell having a prearranged temperature dependence at least partly opposite to said predetermined temperature dependence, whereby said cells may be connected to one another so as to reduce said predetermined temperature dependence.

12. A charge cell, for use in measuring charge values, free of any electrolyte and free of any glassy or amorphous composition, and arranged to transfer charges between two electrodes, so that at the end of said transfer the potential difference across said charge cell will suddenly increase,
    comprising in combination,
    two electrically conducting electrodes spaced apart from one another, and
    a single thin layer consisting of silicon dioxide disposed between said electrodes, and including a predetermined quantity of carriers of a positive charge trapped and remained trapped therein.

* * * * *